US012707706B2

(12) United States Patent
Furukawa et al.

(10) Patent No.: US 12,707,706 B2
(45) Date of Patent: Aug. 11, 2026

(54) SEMICONDUCTOR DEVICE, METHOD FOR MANUFACTURING THE SEMICONDUCTOR DEVICE, AND POWER CONVERSION DEVICE

(71) Applicant: Hitachi Power Semiconductor Device, Ltd., Ibaraki (JP)

(72) Inventors: Tomoyasu Furukawa, Tokyo (JP); Tomoyuki Miyoshi, Tokyo (JP)

(73) Assignee: HITACHI POWER SEMICONDUCTOR DEVICE, LTD., Ibaraki (JP)

( * ) Notice: Subject to any disclaimer, the term of this patent is extended or adjusted under 35 U.S.C. 154(b) by 232 days.

(21) Appl. No.: 18/566,891

(22) PCT Filed: Jun. 27, 2022

(86) PCT No.: PCT/JP2022/025457
§ 371 (c)(1),
(2) Date: Dec. 4, 2023

(87) PCT Pub. No.: WO2023/032439
PCT Pub. Date: Mar. 9, 2023

(65) Prior Publication Data

US 2024/0274708 A1 Aug. 15, 2024

(30) Foreign Application Priority Data

Sep. 2, 2021 (JP) ................................ 2021-143335

(51) Int. Cl.
*H10D 84/00* (2025.01)
*H10D 30/01* (2025.01)
(Continued)

(52) U.S. Cl.
CPC ....... *H10D 84/144* (2025.01); *H10D 30/0297* (2025.01); *H10D 30/668* (2025.01); *H10W 44/401* (2026.01)

(58) Field of Classification Search
CPC ............ H10D 84/144; H10D 30/0297; H10D 30/668; H10D 12/211; H10D 12/021; H10D 62/13; H10D 64/23; H10W 44/401
See application file for complete search history.

(56) References Cited

U.S. PATENT DOCUMENTS

2008/0164516 A1 7/2008 Darwish
2008/0166845 A1* 7/2008 Darwish ............... H10D 30/66
257/E21.345

(Continued)

FOREIGN PATENT DOCUMENTS

CN 104900690 A 9/2015
CN 111788695 A 10/2020

(Continued)

OTHER PUBLICATIONS

International Search Report, mailed Sep. 20, 2022, for International Application No. PCT/JP2022/025457.

(Continued)

*Primary Examiner* — Douglas W Owens
(74) *Attorney, Agent, or Firm* — Baker Botts L.L.P.

(57) ABSTRACT

A MOS control diode obtained by adding a MOS control function to a PN diode, comprises: a semiconductor substrate having a PN junction diode that consists of a conductivity-type drift layer and a conductivity-type anode layer; a first conductivity-type well layer on the anode layer; a second conductivity-type low-concentration source layer on the well layer; a second conductivity-type high-concentration source layer only on a portion of the low-concentration source layer; gate electrodes that are located adjacent to, by way of gate oxide films, the anode layer, the well layer, and (Continued)

the low-concentration source layer, and that constitutes a MOSFET; an insulating film that covers the anode layer, the low-concentration and high-concentration source layers, and the gate electrodes; and a contact hole that penetrates the insulating film, the well layer, and the low-concentration and high-concentration source layers.

9 Claims, 6 Drawing Sheets

(51) Int. Cl.
*H10D 30/66* (2025.01)
*H10W 44/00* (2026.01)

(56) References Cited

U.S. PATENT DOCUMENTS

2012/0161224 A1 6/2012 Eckel et al.
2014/0048847 A1 2/2014 Yamashita et al.
2015/0249083 A1 9/2015 Okawara et al.
2017/0040316 A1 2/2017 Soeno
2018/0315747 A1 11/2018 Agam et al.
2019/0214490 A1 7/2019 Leendertz et al.
2021/0057537 A1* 2/2021 Mori .................... H10D 12/038
2022/0384594 A1* 12/2022 Xu ..................... H10D 30/0297
2024/0274708 A1* 8/2024 Furukawa ............ H10D 12/211

FOREIGN PATENT DOCUMENTS

EP 3573109 A1 11/2019
JP 2012-146977 A 8/2012
JP 2016-006891 A 1/2016
JP 2018-117044 A 7/2018
JP 2019-149511 A 9/2019
JP 2019-216223 A 12/2019

OTHER PUBLICATIONS

Office Action and Search Report dated Apr. 17, 2026 for Chinese Application No. 202280040459.7 (with English translation).

* cited by examiner 101
102
104
n−
(a)
107
7
111
112
113
103
104
p
p+
n
p
n−
(c)
108
107
101
102
103
104
111
112
113
109
p
p+
n
p
n−
(e)
103
104
p
n
p
n−
112
113
(b)
107
103
104
111
112
113
109
p
p+
n
p
n−
(d)
108
107
101
102
103
104
105
106
111
112
113
109
p
p+
n
p
n−
n+
(f)

101
102
104
n−
(a)
103
104
112
113
p
n
p
n−
(b)
10
107
111
112
113
103
104
p+
p
n
p
n−
(c)
107
110
111
112
113
103
104
109
p
n−
(d)
108
107
101
102
103
104
110
111
112
113
109
p
n−
(e)
108
107
101
102
103
104
105
106
110
111
112
113
109
p
n−
n+
(f)

108 107 201 102 103 104 105 106 110 111 112 113 109 p p+ p+ p n n p n− n+

SEMICONDUCTOR DEVICE, METHOD FOR MANUFACTURING THE SEMICONDUCTOR DEVICE, AND POWER CONVERSION DEVICE

TECHNICAL FIELD

The present invention relates to structures of semiconductor devices, methods for manufacturing the same, and power conversion devices using the same, and particularly relates to effective technologies applicable to MOS control diodes including pn diodes equipped with MOS control functions.

BACKGROUND ART

Along with the demand for energy saving and the widespread use and expansion of renewable energy in recent years, power conversion devices such as inverters and converters have been used in a wide range of fields such as power, industries, transportations, and homes. In order to realize a decarbonized society, widespread use of such power conversion devices is essential.

An inverter for realizing energy saving is adapted to convert electric energy from a DC power supply Vcc into AC electric energy with a desired frequency using insulated gate bipolar transistors (IGBTs), which are power semiconductor devices of one type, thereby variably changing the rotational speed of a motor. A flywheel diode (freewheel diode) is connected reversely in parallel to each of the IGBTs, which are capable of supplying electric power with a desired frequency to the motor. In order to attain higher efficiency, size reduction, and cost reduction of an inverter for promoting the widespread use of the inverter, it is necessary to reduce the conduction loss and the switching loss in the flywheel diodes, similarly to those of the IGBTs.

In a power semiconductor device having a rated voltage of several hundred volts or more, in general, such flywheel diodes are constituted by pn diodes using silicon which can be increased in conductivity by injecting electric charges thereinto, in order to reduce the forward voltage.

Further, there are Schottky diodes as diodes which induce injection of few electric charges and extremely small reverse recovery currents, as compared with pn diodes. However, such Schottky diodes induce larger forward voltages due to silicon, which increases the loss in an inverter for handling large currents.

As techniques for reducing the conduction loss and the recovery loss in a diode, there have been known techniques of connecting a diode having a switching function in parallel thereto, which are described in PTL 1 and PTL 2.

PTL 1 describes a diode structured to include a normally-connected diode, and a switch-equipped diode which can be controlled in conduction/non-conduction through a control gate, such that the normally-connected diode, and the switch-equipped diode are connected in parallel to each other. The diode described in PTL 1 is configured to include a normally-connected diode portion, and a diode portion equipped with conduction/non-conduction controlling functions through a longitudinal MOSFET switch, which are connected in parallel to each other, in which the longitudinal MOSFET switch is structured to have a trench-embedded shaped gate.

Further, PTL 2 describes a diode structured to include a normally-connected diode, and a switch-equipped diode which can be controlled in conduction/non-conduction through a control gate, such that the normally-connected diode, and the switch-equipped diode are connected in parallel to each other. The diode described in PTL 2 is configured to include a normally-connected diode portion, and a diode portion equipped with conduction/non-conduction controlling functions through a longitudinal MOSFET switch, which are connected in parallel to each other, in which the longitudinal MOSFET switch is structured to have a trench-embedded shaped gate, similarly to the diode described in PTL 1.

CITATION LIST

Patent Literatures

PTL 1: JP 2012-146977 A
PTL 2: JP 2019-149511 A

SUMMARY OF INVENTION

Technical Problem

However, with the aforementioned PTL 1, hole carriers are injected from a p-type anode auxiliary layer (204) in the normally-connected diode, regardless of the gate voltage. Therefore, even if the switch-equipped diode portion is brought into a non-conductive state immediately before a recovery state, hole carriers remain in a cathode drift layer (202). Due to the presence of these hole carriers, there is a limit to the reduction of the recovery current. This has made it difficult further improve the trade-off characteristics between the conduction loss and the recovery loss in the diode with this configuration.

Further, with the aforementioned PTL 2, as in FIG. 1 of PTL 2, a $p^+$ layer (high-concentration source layer) 16 has the same thickness as that of a p layer (low-concentration source layer) 15, and the $p^+$ layer 16 is in direct contact with an n layer (well layer) 14, so that holes are directly injected from the $p^+$ layer 16 into the n layer 14, which causes a risk of breakdown of the element due to an operation of the thyristor constituted by the $p^+$ layer 16, the n layer 14, a p layer (anode layer) 13, and a $n^-$ layer (drift layer) 12.

For coping therewith, it is an object of the present invention to provide a semiconductor device with high performance which is capable of reducing both the conduction loss and the recovery loss in a MOS control diode including a pn diode equipped with a MOS control function, a method for manufacturing the same, and a power conversion device using the same.

Solution to Problem

In order to overcome the aforementioned problem, a semiconductor device according to the present invention includes a semiconductor substrate having a drift layer of a first conductivity type, an anode layer of a second conductivity type provided on the drift layer and constituting a PN junction diode together with the drift layer, a well layer of the first conductivity type provided on the anode layer, a low-concentration source layer of the second conductivity type provided on the well layer;

a high-concentration source layer of the second conductivity type provided only in a portion of the low-concentration source layer, a gate electrode which is adjacent to the anode layer, the well layer, and the low-concentration source layer with a gate oxide film interposed therebetween and constitutes a MOSFET together with the anode layer, the well layer, and the low-concentration source layer, an insulating film covering the anode layer, the low-concentration source layer, the high-concentration source layer, and the gate electrode, and a contact hole penetrating the insulating film, the high-concentration source layer, the low-concentration source layer, and the well layer.

Further, a method for manufacturing a semiconductor device according to the present invention includes (a) a process for forming an anode layer of a second conductivity type on a semiconductor substrate having a drift layer of a first conductivity type, (b) a process for forming a well layer of the first conductivity type on the anode layer, (c) a process for forming a low-concentration source layer of the second conductivity type on the well layer, (d) a process for forming an insulating film on the low-concentration source layer, and forming a contact hole in the insulating film by photolithography and dry etching, (e) a process for forming a high-concentration source layer of the second conductivity type only in a portion of the low-concentration source layer by oblique ion injection through the contact hole, and (f) a process for extending the contact hole by dry etching using the insulating film as a mask to cause the contact hole to penetrate the high-concentration source layer, the low-concentration source layer, and the well layer.

Further, a method for manufacturing a semiconductor device according to the present invention includes (a) a process for forming an anode layer of a second conductivity type on a semiconductor substrate having a drift layer of a first conductivity type, (b) a process for forming a well layer of the first conductivity type on the anode layer, (c) a process for forming a low-concentration source layer of the second conductivity type on the well layer, (d) a process for forming an insulating film on the low-concentration source layer, and forming a contact hole in the insulating film by photolithography and dry etching, (e) a process for forming a high-concentration source layer of the second conductivity type only in a portion of the low-concentration source layer by vertical ion injection through the contact hole, (f) a process for forming an insulating film on the high-concentration source layer, and thinning the insulating film by dry etching to form an insulating film spacer in the contact hole, and (g) a process for extending the contact hole by dry etching using the insulating film spacer as a mask to cause the contact hole to penetrate the high-concentration source layer, the low-concentration source layer, and the well layer.

Further, a power conversion device according to the present invention includes a pair of DC terminals, AC terminals, the number of which being equal to the number of phases of an AC output, switching legs, the number of which being equal to the number of the phases of the AC output, each switching leg being connected between the pair of DC terminals and comprising two parallel circuits connected in series to each other, each parallel circuit comprising a switching element and a diode connected reversely in parallel to the switching element, and a gate circuit for controlling the switching element and the diode, in which the diode comprises the semiconductor device having the aforementioned characteristics.

Advantageous Effects of Invention

According to the present invention, it is possible to realize a semiconductor device with high performance which is capable of reducing both the conduction loss and the recovery loss a MOS control diode including a pn diode equipped with a MOS control function, and it is also possible to realize a method for manufacturing the same, and a power conversion device using the same.

Other problems, structures and effects than those described above will be clarified by the following description of embodiments.

DESCRIPTION OF EMBODIMENTS

Figure 1:
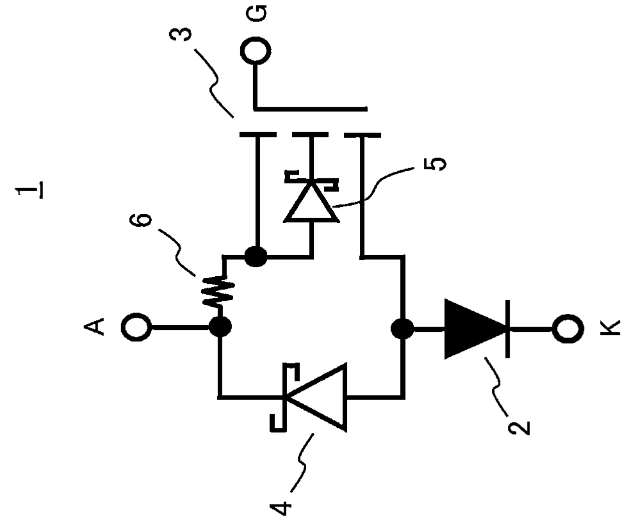
FIG. 1 is a cross-sectional view and an equivalent circuit diagram of a semiconductor device according to a first example of the present invention.
Figure 1:
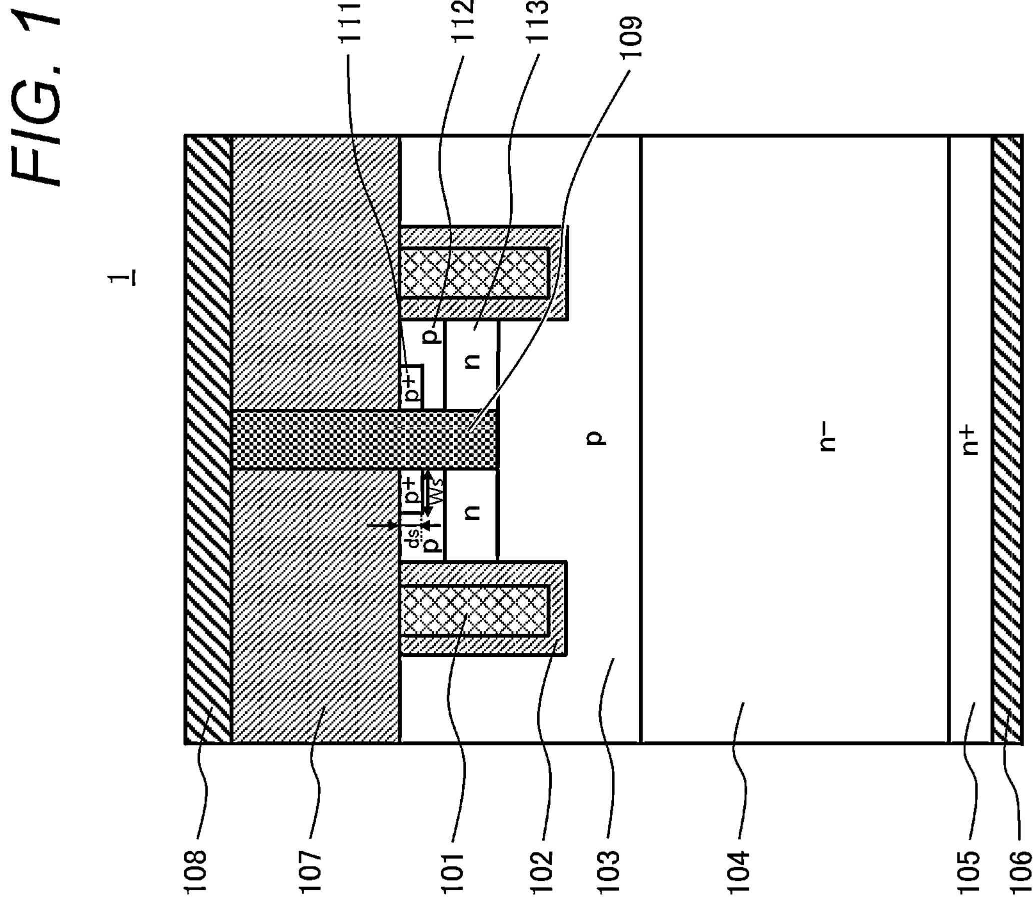

Hereinafter, examples of the present invention will be described with reference to the drawings. Incidentally, throughout the respective drawings, the same structures are denoted by the same reference numerals, and will not be described in detail regarding their redundant portions.

Further, in each of the following examples, there will be described an example where the anode layer 103, the high-concentration source layer 111, and the low-concentration source layer 112 are formed of a p-type conductive layer, the drift layer 104, the cathode layer 105, and the well layer 113 are formed of an n-type conductive layer, and the MOSFET 3 is formed as a p-channel MOSFET. However, the present invention can be also applied to cases where the respective layers are formed to be of the opposite conductivity types to provide the same effects.

First Example

With reference to FIGS. 1 to 4, there will be described a semiconductor device according to a first example of the present invention, regarding its configuration and operations, and, also, there will be described a method for manufacturing the same.

Figure 2:
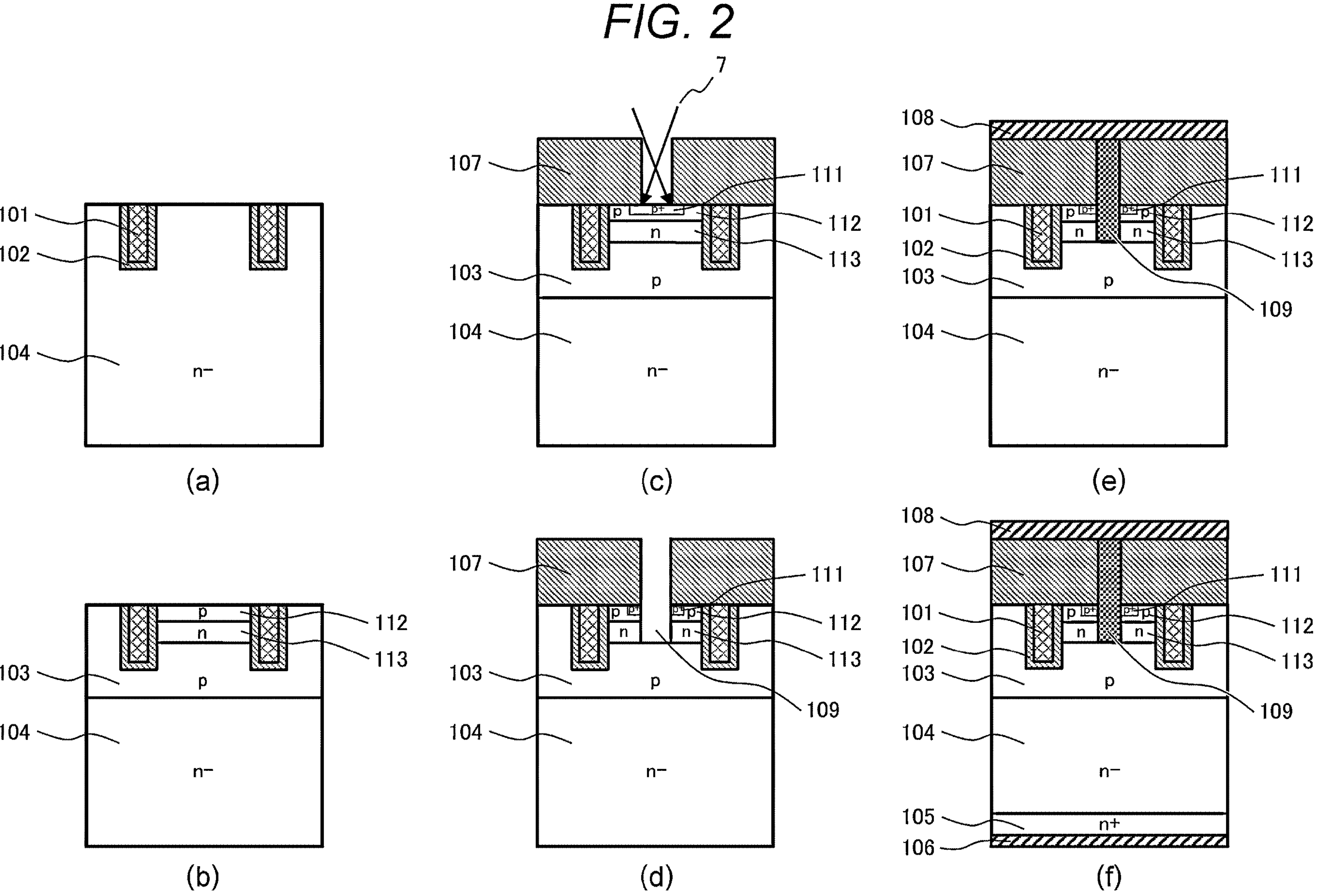
FIG. 2 is a view illustrating a method for manufacturing the semiconductor device in FIG. 1.
Figure 3:
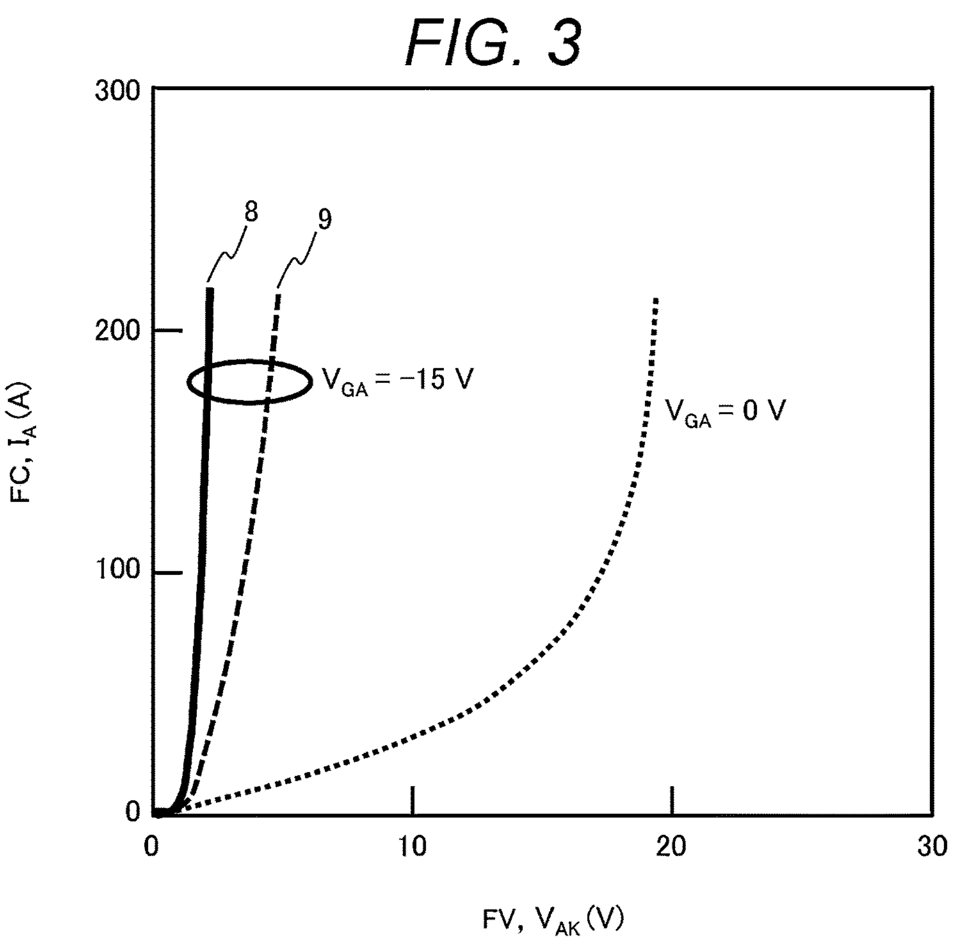
FIG. 3 is a view illustrating a forward characteristic of the semiconductor device in FIG. 1.
Figure 4:
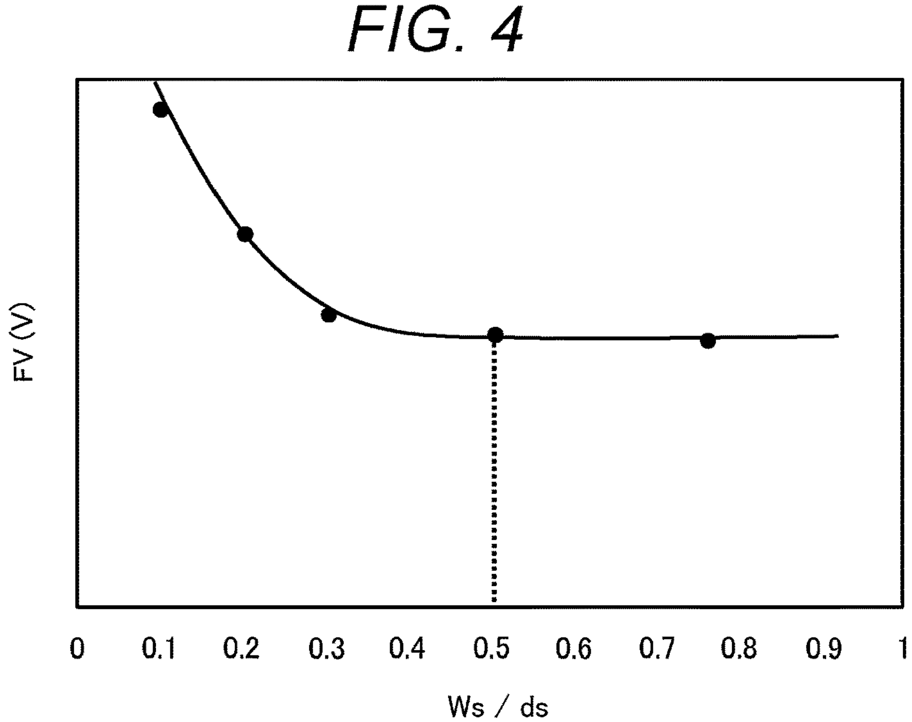
FIG. 4 is a view illustrating the relationship between the forward voltage and the ratio (Ws/ds) of the width to the thickness of a $p^+$ source layer in the semiconductor device in FIG. 1.

FIG. 1 is a cross-sectional view and an equivalent circuit diagram of a MOS control diode 1 according to the present example. FIG. 2 is a view illustrating a method for manufacturing the MOS control diode 1 in FIG. 1. FIG. 3 is a view illustrating a forward characteristic of the MOS control diode 1 in FIG. 1. FIG. 4 is a view illustrating the relationship between the forward voltage and the ratio (Ws/ds) of the width to the thickness of a $p^+$ source layer in the MOS control diode 1 of FIG. 1.

As illustrated in FIG. 1, the MOS control diode 1 according to the present example includes an $n^-$ drift layer 104 as a first conductivity-type (n-type) drift layer, a P2 layer (anode layer) 103 of a second conductivity type (p-type) which is formed on the $n^-$ drift layer 104, an n-well layer 113 as a first conductivity-type (n-type) well layer which is formed on the P2 layer 103, a P1 layer (low-concentration source layer) 112 of the second conductivity type which is formed on the n-well layer 113, and a high-concentration source $p^+$ layer 111 formed on a portion of the P1 layer 112. The $n^-$ drift layer 104 as the first conductivity-type ($n^-$ type) drift layer is constituted by an $n^-$-type semiconductor substrate.

In the P2 layer 103, there is formed a plurality of trench gates 101 (two trench gates in FIG. 1) as embedded gate electrodes, with a gate oxide film 102 interposed therebetween.

On the trench gates 101, the gate oxide film 102, the high-concentration source $p^+$ layer 111, and the P1 layer 112, there is formed an insulating oxide film 107 in such a way as to cover them.

An anode electrode 108 is formed on the insulating oxide film 107.

On the other hand, an $n^+$ layer (cathode layer) 105 is formed on the lower layer side of the $n^-$ drift layer 104, namely, on the opposite side thereof from the side on which the P2 layer 103 is formed. Further, therebelow, there is formed a cathode electrode 106.

In the n-well layer 113, the P1 layer 112, the high-concentration source $p^+$ layer 111, and the insulating oxide film 107, there is formed a contact hole 109 penetrating therethrough and reaching the P2 layer 103. In the contact hole 109, a metal material such as aluminum (Al) or tungsten (W) is embedded to form a contact. Through this contact, the anode electrode 108 is electrically connected to the high-concentration source $p^+$ layer 111, the P1 layer 112, the n-well layer 113, and the P2 layer 103.

Here, the width Ws of the high-concentration source $p^+$ layer 111, which is measured from the contact hole 109, is made to be equal to or more than ½ of the thickness ds of the high-concentration source $p^+$ layer 111. Further, the width Ws of the high-concentration source $p^+$ layer 111, which is measured from the contact hole 109, is made to be equal to or less than the thickness ds of the high-concentration source $p^+$ layer 111.

There will be described the principle of operations and effects of the MOS control diode 1 according to the present example, using the equivalent circuit diagram illustrated in the right side of FIG. 1.

In the equivalent circuit diagram of FIG. 1, a pn diode 2 corresponds to the P2 layer 103 and the $n^-$ drift layer 104, a p-channel MOSFET 3 corresponds to the P2 layer 103, the P1 layer 112 and the n-well layer 113, a p-type Schottky diode 4 corresponds to the P2 layer 103 and the contact hole 109, an n-type Schottky diode or a pn diode 5 corresponds to the contact hole 109 and the n-well layer 113, and a $p^+$ source resistance 6 corresponds to the high-concentration source $p^+$ layer 111 and the P1 layer 112, respectively.

If a positive potential is applied to the anode electrode 108 (anode A) while a negative potential is applied to the cathode electrode 106 (cathode K), and a negative potential with respect to the potential of the anode electrode 108 (anode A) is applied to the trench gates 101 (gates G), a p-channel is formed in the surfaces of the P1 layer 112, the n-well layer 113, and the P2 layer 103 closer to the gate oxide film 102, which causes the p-channel MOSFET including the P1 layer 112, the n-well layer 113, and the P2 layer 103 to conduct.

Then, the P2 layer 103 and the $n^-$ drift layer 104 are forward biased, so that a large amount of holes are injected from the P2 layer 103 into the $n^-$ drift layer 104. The holes injected into the $n^-$ drift layer 104 promote injection of electrons from the $n^+$ layer 105, which brings the $n^-$ drift layer 104 into a state where a large amount of holes and electrons have been accumulated therein, thereby modulating the conductivity thereof to lower the resistance. This results in reduction of the forward voltage, thereby reducing the conduction loss.

On the other hand, when a negative potential is applied to the anode electrode 108 (anode A) while a positive potential is applied to the cathode electrode 106 (cathode K) to perform reverse recovery to a blocking state, the potential of the trench gates 101 (gates G) is set to be the same potential as or a positive potential with respect to the potential of the anode electrode 108 (anode A) immediately before the reverse recovery, thereby bringing the p-channel MOSFET into an off state.

This suppresses the injection of holes from the P2 layer 103, which reduces the accumulated electric charges of holes and electrons in the $n^-$ drift layer 104. If reverse recovery is performed thereafter, the reverse recovery current is reduced, which also reduces the reverse recovery loss. At this time, the potential of the cathode electrode 106 (cathode K) rapidly rises to have a high voltage, thereby applying dv/dt thereto.

In the MOS control diode 1 according to the present example, the gate oxide film 102 is surrounded by the P2 layer 103, the n-well layer 113, and the P1 layer 112 being at a potential substantially equal to that of the anode electrode 108, which prevents a displacement current due to dv/dt from flowing into the trench gates 101, thereby stabilizing the gate potential. As a result, the gate potential can be maintained at the same potential as or a positive potential with respect to the potential of the anode electrode 108.

This can prevent breakdown of the gate oxide film in the event of high dv/dt.

As described above, with the MOS control diode 1 according to the present example, by controlling the potential of the trench gates 101 with respect to the anode electrode 108, it is possible to turn on/off the p-channel MOSFET including the P1 layer 112, the n-well layer 113, and the P2 layer 103, which enables reduction of the conduction loss and the reverse recovery loss.

Here, if holes are directly injected from the high-concentration source $p^+$ layer 111 formed in the P1 layer 112, this may operate the thyristor including the high-concentration source $p^+$ layer 111, the n-well layer 113, the P2 layer 103, the $n^-$ drift layer 104, and the $n^+$ layer 105, which may cause breakdown of the element and deterioration of the controllability.

In order to suppress direct injection of holes from the high-concentration source $p^+$ layer 111, it is effective to place the P1 layer 112 having lower hole injection efficiency between the high-concentration source $p^+$ layer 111 and the gate oxide film 102 and between the high-concentration source $p^+$ layer 111 and the n-well layer 113, for connecting the high-concentration source $p^+$ layer 111 and the gate oxide film 102 to each other and connecting the high-concentration source $p^+$ layer 111 and the n-well layer 113 to each other with the P1 layer 112 having the lower hole injection efficiency interposed therebetween.

Further, the high-concentration source $p^+$ layer 111 is in contact with the anode electrode 108 with a barrier metal (not illustrated) embedded in the contact hole 109 interposed therebetween, and forms a portion of the source resistance of the p-channel MOSFET. Therefore, in order to reduce the conduction loss, it is necessary to reduce the resistance of the high-concentration source $p^+$ layer 111. In order to reduce the resistance of the high-concentration source $p^+$ layer 111, there are a method of increasing the concentration and a method of adjusting the shape and dimension.

FIG. 3 is a view illustrating a forward characteristic of the MOS control diode 1 in FIG. 1. In FIG. 3, the horizontal axis represents the forward voltage FV between the anode (A) and the cathode (K), while the vertical axis represents the forward current FC flowing through the anode (A). $V_{GA}$ is a voltage applied between the gate (G) and the anode (A). Further, a reference numeral of 8 denotes a forward characteristic of the present invention, while a reference numeral of 9 denotes a forward characteristic of a prior art.

As illustrated in FIG. 3, due to the effect of setting the ratio (Ws/ds) of the width Ws of the high-concentration source $p^+$ layer 111, which is measured from the contact hole 109, to the thickness ds of the high-concentration source $p^+$ layer 111 to be equal to or more than ½ for reducing the conduction loss, it is possible to reduce the source resistance.

FIG. 4 illustrates the result of study made by the inventors of the present application, regarding the forward voltage and the ratio (Ws/ds) of the width Ws to the thickness ds of the high-concentration source $p^+$ layer 111, in which the width Ws was measured from the contact hole 109 penetrating the high-concentration source $p^+$ layer 111 provided in the P1 layer 112, the P1 layer 112, and the $n^-$ well layer 113.

As illustrated in FIG. 4, as the ratio (Ws/ds) of the width Ws to the thickness ds of the high-concentration source $p^+$ layer 111 is larger, the forward voltage FV can be reduced, and the forward voltage is stably reduced when this ratio is equal to or more than ½.

With reference to FIG. 2, there will be described a method for manufacturing the MOS control diode 1 in FIG. 1.

First, as illustrated in FIG. 2(*a*), a semiconductor substrate for manufacturing the MOS control diode 1 is prepared. In the present example, an $n^-$-type Si wafer having an $n^-$ drift layer 104 as a first conductivity-type (n-type) drift layer is used as a semiconductor substrate.

Here, as a Si wafer, it is possible to employ a wafer having a specific resistance corresponding to a withstand voltage.

For example, for a diode having a withstand voltage of 1.2 kV, the specific resistance can be made to be about 50 to 60 Ωcm. For a diode having a withstand voltage of 3.3 kV, the specific resistance can be made to be about 250 to 300 Ωcm. Thus, the $n^-$ drift layer 104 is formed therefrom.

In a first process which is not illustrated, a silicon oxide film is formed on the entire surface of the Si wafer through thermal oxidation. Next, trench formation regions are formed by patterning with a resist through a photolithography process. The silicon oxide film is etched by dry etching using the resist as a mask, Subsequently, the Si is processed by dry etching using the silicon oxide film as a mask, thereby forming trenches. Thereafter, a gate oxide film 102 is formed on the entire surface of the Si wafer including the insides of the trenches through thermal oxidation. Thereafter, a poly-silicon (Poly-Si) film is deposited in such a way as to fill the insides of the trenches. Then, dry etching process is performed thereon, thereby forming trench gates 101.

Subsequently, as illustrated in FIG. 2(*b*), an active region of the diode is formed by resist patterning through a photolithography process, and boron ions are injected thereinto, thereby forming a P2 layer 103. Next, resist patterning is performed through a photolithography process, phosphorus (P) ions are injected thereinto to form a n-well layer 113, and, further, boron (B) ions are further injected thereinto to form a P1 layer 112.

Subsequently, as illustrated in FIG. 2(*c*), an insulating oxide film 107 is deposited. Thereafter, resist patterning is performed thereon through a photolithography process, and the insulating oxide film 107 is etched. Thereafter, boron (B) ions are injected thereinto using the insulating oxide film 107 as a mask, thereby forming a high-concentration source $p^+$ layer 111. At this time, the high-concentration source $p^+$ layer 111 is formed in the P1 layer 112 using oblique ion injection 7.

In order to reduce the source resistance, the inclination angle of the oblique ion injection 7 is adjusted, such that the width Ws of the high-concentration source $p^+$ layer 111 measured from a contact hole 109, which will be described later, is equal to or more than ½ of the thickness ds of the high-concentration source $p^+$ layer 111, in which the contact hole 109 penetrates the high-concentration source $p^+$ layer 111 provided in the P1 layer 112, the P1 layer 112, and the n-well layer 113. Preferably, it is effective to make the inclination angle equal to or more than 27° for reducing the source resistance. However, since the oblique ion injection 7 is performed through the contact hole formed in the insulating oxide film 107, the upper limit of the inclination angle of the oblique ion injection 7 is about 45°. When the inclination angle of the oblique ion injection 7 is 45°, the ratio (Ws/ds) of the width Ws of the high-concentration source $p^+$ layer 111 which is measured from the contact hole 109 to the thickness ds of the high-concentration source $p^+$ layer 111 is 1.

Subsequently, as illustrated in FIG. 2(*d*), the contact hole 109 is processed by dry etching using the insulating oxide film 107 as a mask, until it reaches the P2 layer 103.

Thereafter, as illustrated in FIG. 2(*e*), a barrier metal (for example, a laminated-layer configuration formed from Ti/TiN) is deposited by sputtering on the entire surface of the insulating oxide film 107 including the inside of the contact hole 109. Thereafter, a metal material such as tungsten (W) is deposited in such a way as to fill the inside of the contact hole 109. After the inside of the contact hole 109 is filled therewith, planarization is performed by etch-back. Subsequently, a metal material (for example, AlSi) is deposited on the entire surface of the insulating oxide film 107 by sputtering. Thereafter, resist patterning is performed thereon through a photolithography process, and an anode electrode 108 is formed through a process using the resist as a mask.

Subsequently, as illustrated in FIG. 2(*f*), the back surface of the Si wafer is ground to a desired wafer thickness for each withstand voltage. Thereafter, phosphorus (P) ions are injected thereinto from its back surface, and laser annealing is performed thereon to perform activation, thereby forming an $n^+$ layer 105. Preferably, the thickness of the wafer is, for example, about 90 to 120 μm for a diode having a withstand voltage of 1.2 kV, and about 330 to 400 μm for a diode having a withstand voltage of 3.3 kV. Finally, a cathode electrode 106 is formed by sputtering, and the manufacturing of the MOS control diode 1 is completed.

Consequently, in the MOS control diode including the pn diode equipped with a MOS control function, it is possible to attain reduction of both the conduction loss and the recovery loss.

Second Example

Figure 5:
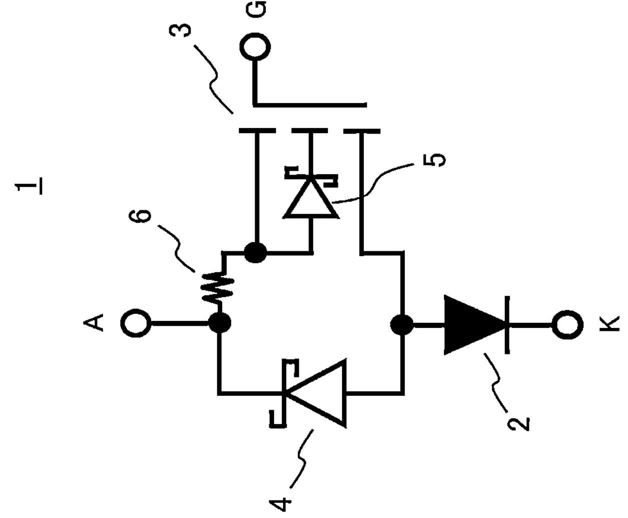
FIG. 5 is a cross-sectional view and an equivalent circuit diagram of a semiconductor device according to a second example of the present invention.
Figure 5:
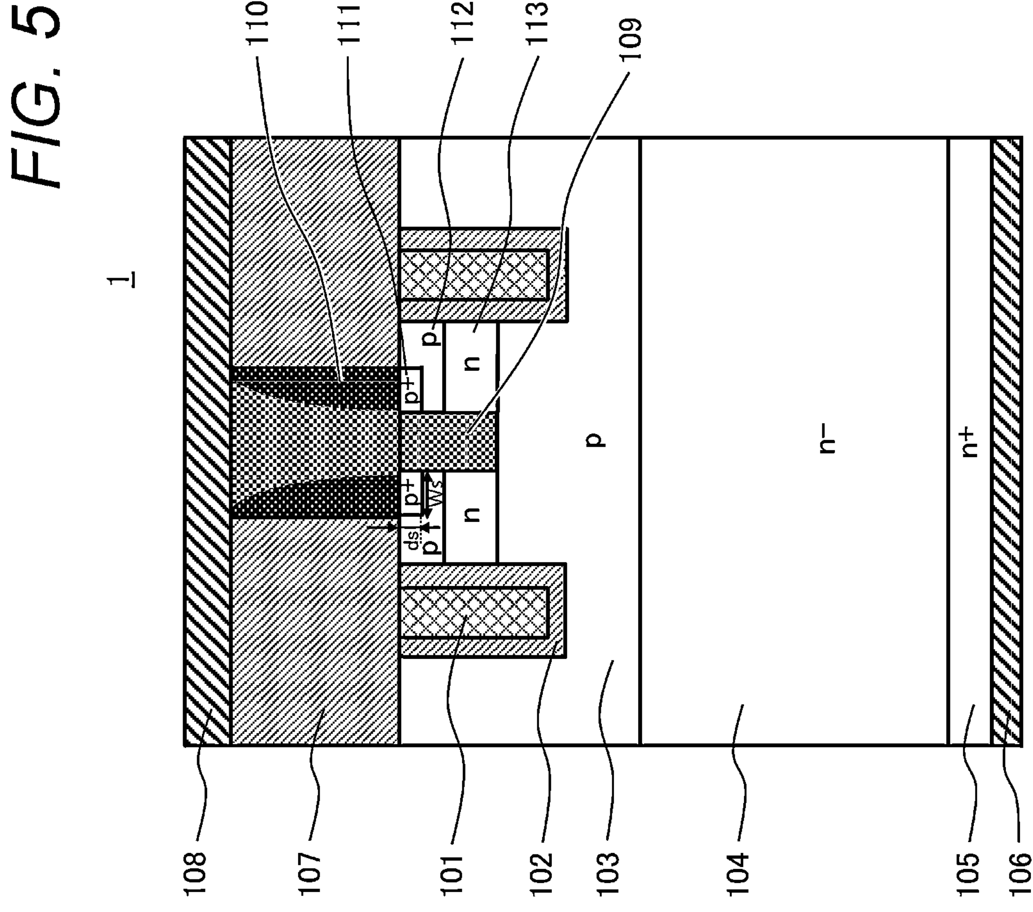
Figure 6:
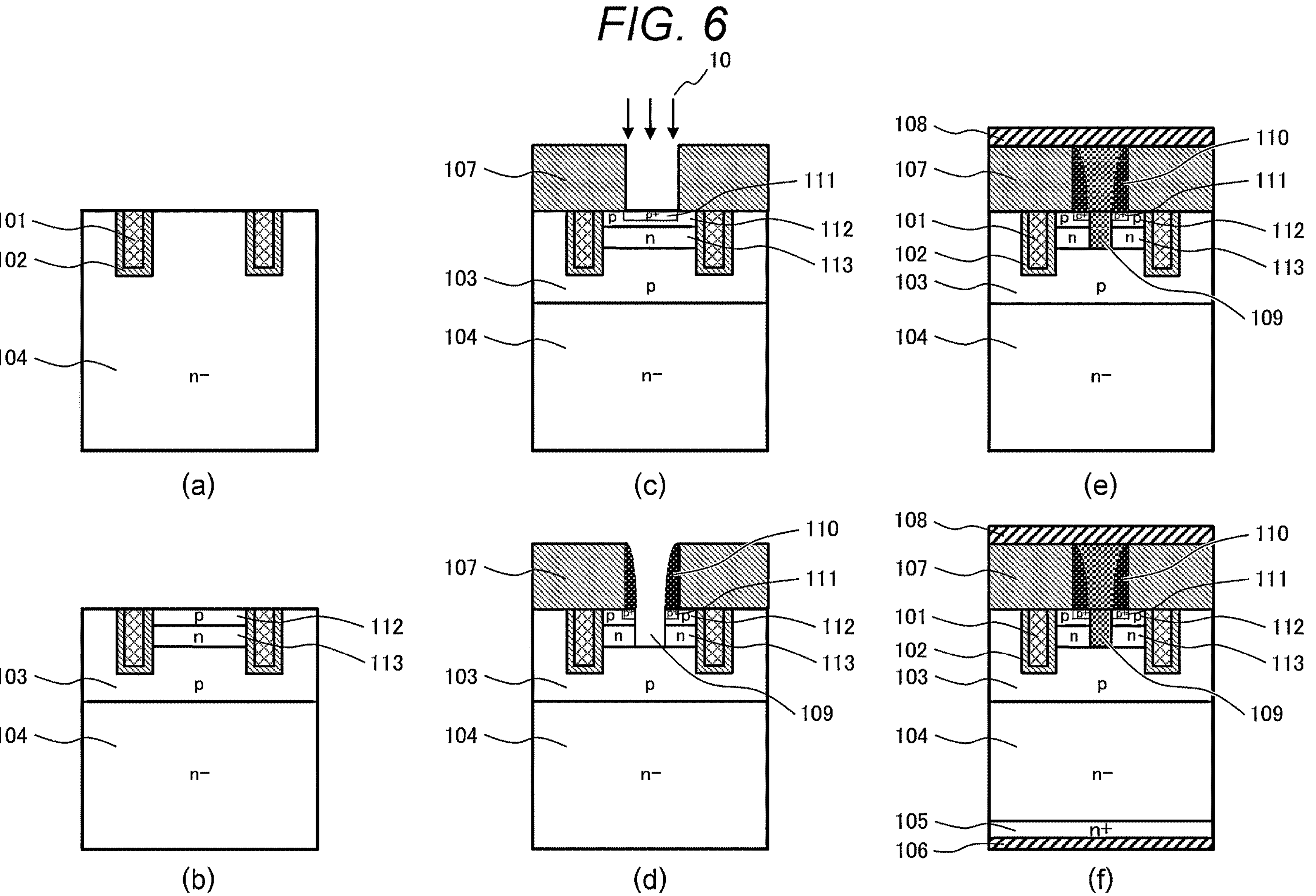
FIG. 6 is a view illustrating a method for manufacturing the semiconductor device in FIG. 5.

With reference to FIGS. 5 and 6, there will be described a semiconductor device according to a second example of the present invention, regarding its configuration, and, also, there will be described a method for manufacturing the same.

FIG. 5 is a cross-sectional view and an equivalent circuit diagram of a MOS control diode 1 according to the present example. FIG. 6 is a view illustrating a method for manufacturing the MOS control diode 1 in FIG. 5.

As illustrated in FIG. 5, the MOS control diode 1 according to the present example is different from the MOS control diode 1 according to the first example (FIG. 1), in having an insulating film spacer 110 having a side wall shaped such that its lower surface is narrower than its upper surface, on the side wall of a contact hole 109 provided in an insulating oxide film 107. Namely, the contact hole 109 has a side wall shaped such that its lower surface is narrower than its upper surface. The other structures are the same as those of the first example (FIG. 1) including the point that the ratio (Ws/ds) of the width Ws of the high-concentration source $p^+$ layer 111, which is measured from the contact hole 109, to the thickness ds of the high-concentration source $p^+$ layer 111 is equal to or more than ½.

With reference to FIG. 6, there will be described a method for manufacturing the MOS control diode 1 in FIG. 5. Incidentally, FIGS. 6(*a*) and (*b*) are the same as FIGS. 2(*a*) and (*b*), and will not be described.

After trench gates 101, a n-well layer 113, and a P1 layer 112 are formed, as illustrated in FIG. 6(*c*), an insulating oxide film 107 is deposited and, thereafter, resist patterning is performed thereon through a photolithography process, and the insulating oxide film 107 is etched. Thereafter, boron (B) ions are injected thereinto using the insulating oxide film 107 as a mask, thereby forming a high-concentration source $p^+$ layer 111. At this time, the high-concentration source $p^+$ layer 111 is formed in the P1 layer 112 using vertical ion injection 10.

Subsequently, as illustrated in FIG. 6(*d*), an insulating film (for example, a TEOS film or a SiN film) is deposited and, then, is etched back by dry etching, thereby forming an insulating film spacer 110. Subsequently, a contact hole 109 is processed by dry etching using the insulating oxide film 107 and the insulating film spacer 110 as a mask, until it reaches the P2 layer 103.

Thereafter, as illustrated in FIG. 6(*e*), a barrier metal (for example, a laminated-layer configuration formed from Ti/TiN) is deposited by sputtering on the entire surface of the insulating oxide film 107 including the inside of the insulating film spacer 110 and the contact hole 109. Thereafter, a metal material such as tungsten (W) is deposited in such a way as to fill the inside of the insulating film spacer 110 and the contact hole 109. After the inside of the insulating film spacer 110 and the contact hole 109 is filled therewith, planarization is performed by etch-back. Subsequently, a metal material (for example, AlSi) is deposited on the entire surface of the insulating oxide film 107 by sputtering. Thereafter, resist patterning is performed thereon through a photolithography process, and an anode electrode 108 is formed through a process using the resist as a mask.

Subsequently, as illustrated in FIG. 6(*f*), the back surface of the Si wafer is ground to a desired wafer thickness for each withstand voltage. Thereafter, phosphorus (P) ions are injected thereinto from its back surface, and laser annealing is performed thereon to perform activation, thereby forming an $n^+$ layer 105. Preferably, the thickness of the wafer is, for example, about 90 to 120 μm for a diode having a withstand voltage of 1.2 kV, and about 330 to 400 μm for a diode having a withstand voltage of 3.3 kV. Finally, a cathode electrode 106 is formed by sputtering, and the manufacturing of the MOS control diode 1 is completed.

In the present example, due to the insulating film spacer 110, the width Ws of the high-concentration source $p^+$ layer 111 measured from the contact hole 109 penetrating the high-concentration source $p^+$ layer 111 provided in the P1 layer 112, the P1 layer 112 and the n-well layer 113 is equal to or more than ½ of the thickness ds of the high-concentration source $p^+$ layer 111, which reduces the forward voltage and provides stable characteristics. Further, unlike the manufacturing method according to the first example, it is possible to increase the degree of freedom in adjusting the ratio (Ws/ds) of the width Ws of the high-concentration source $p^+$ layer 111, which is measured from the contact hole 109, to the thickness ds of the high-concentration source $p^+$ layer 111. This enables making this ratio larger than 1.

With the manufacturing method using the oblique ion injection 7 according to the first example (FIG. 2), if the aspect ratio of the contact portion is increased due to miniaturization of the element, the contact portion is shielded by the insulating oxide film 107, which has imposed a limit on the formation of the high-concentration source $p^+$ layer 111. However, according to the present example (FIG. 6), since the vertical ion injection 10 is performed, and the contact hole 109 is formed using the insulating film spacer 110, the high-concentration source $p^+$ layer 111 can be formed in self-alignment with the contact hole 109 even in a case of a higher aspect ratio.

Third Example

Figures 7, 8:
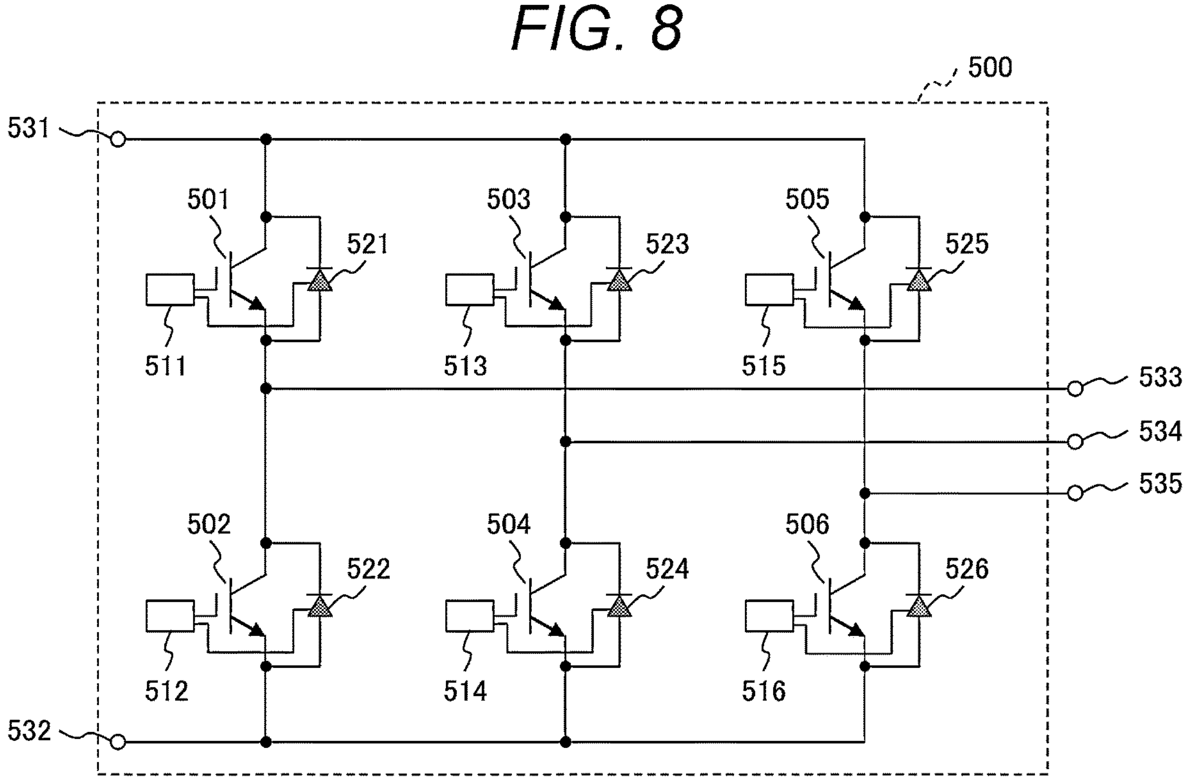
FIG. 7 is a cross-sectional view of a semiconductor device according to a third example of the present invention.
FIG. 8 is a circuit diagram illustrating a schematic structure of a power conversion device according to a fourth example of the present invention.

With reference to FIG. 7, there will be described a semiconductor device according to a third example of the present invention. FIG. 7 is a cross-sectional view of a MOS control diode 1 according to the present example.

As illustrated in FIG. 7, the MOS control diode 1 according to the present example has a side gate configuration with gate electrodes provided on side surfaces in a semiconductor substrate body. Side gates 201 are adjacent to a P2 layer 103, a n-well layer 113, and a P1 layer 112 with a gate oxide film 102 having a substantially L-shaped cross section interposed therebetween, and each side gate 201 is formed such that its upper portion has a width smaller than the width of its lower portion.

The area of the side gates 201 which faces the semiconductor substrate body is about half that of the trench gates 101 in the second example (FIG. 5), which also halves the gate capacitance thereof. This makes it easier to drive the gates. Further, the present configuration can be also structured in the first example, similarly to in the second example.

Fourth Example

With reference to FIG. 8, there will be described a power conversion device according to a fourth example of the present invention. FIG. 8 is a circuit diagram illustrating a schematic structure of the power conversion device according to the present example. FIG. 8 illustrates an example of the circuit structure of the power conversion device 500 and a connection relationship between a DC power supply and a three-phase AC motor (AC load).

In the power conversion device 500 according to the present example, for example, the MOS control diode 1 according to the first example is used as diodes 521 to 526. "501" to "506" denote power switching elements.

As illustrated in FIG. 8, the power conversion device 500 according to the present example includes a P terminal 531 and an N terminal 532 as a pair of DC terminals, and a U terminal 533, a V terminal 534, and a W terminal 535 as AC terminals, the number of which is equal to the number of phases of an AC output.

In addition, the power conversion device 500 includes a switching leg constituted by a pair of power switching elements 501 and 502 connected to each other in series, in such a way as to provide its output to the U terminal 533 connected to the point at which these power switching elements are connected in series to each other. Further, the power conversion device 500 includes a switching leg constituted by power switching elements 503 and 504 having the same structure as that of the aforementioned pair of power switching elements and connected to each other in series, in such a way as to provide its output to the V terminal 534 connected to the point at which these power switching elements are connected in series to each other. Further, the power conversion device 500 includes a switching leg constituted by power switching elements 505 and 506 having the same structure as that of the aforementioned pair of power switching elements and connected to each other in series, in such a way as to provide its output to the W terminal 535 connected to the point at which these power switching elements are connected in series to each other.

The switching legs for the three phases, which are constituted by the power switching elements 501 to 506, are connected between the DC terminals which are the P terminal 531 and the N terminal 532, so that these switching legs are supplied with DC power from a DC power supply which is not illustrated. The U terminal 533, the V terminal 534, and the W terminal 535, which are the three-phase AC terminals in the power conversion device 500, are connected to a three-phase AC motor which is not illustrated, as a three-phase AC power supply.

Respective diodes 521 to 526 are connected reversely in parallel to the power switching elements 501 to 506. Gate circuits 511 to 516 are connected to input terminals of the respective gates of the power switching elements 501 to 506 and to input terminals of the respective gates of the diodes 521 to 526 constituted by the MOS control diodes 1, so that the power switching elements 501 to 506 and the diodes 521 to 526 are controlled by the respective gate circuits 511 to 516. Incidentally, the gate circuits 511 to 516 are overall controlled by an overall control circuit (not illustrated).

The gate circuits 511 to 516 overall and appropriately control the power switching elements 501 to 506 and the diodes 521 to 526, so that the DC power from the DC power supply Vcc is converted into three-phase AC power, and this three-phase AC power is outputted from the U terminal 533, the V terminal 534, and the W terminal 535.

By applying the MOS control diodes 1 according to the first to third examples to the power conversion device 500 according to the present example, it is possible to provide a power conversion device having a lower on-voltage and a lower switching loss.

Incidentally, the present invention is not limited to the aforementioned examples, and includes various modifications. For example, the aforementioned examples have been described in detail, for the purpose of explaining the present invention in such a way as to facilitate understanding the present invention, and the present invention is not necessarily limited to the structure including all the described structures. Further, the structure according to a certain example can be partially replaced with the structure according to another example, and, also, the structure according to a certain example can be additionally provided with the structure according to another example. Further, the structure according to each example can be partially eliminated or replaced with or provided with other structures.

REFERENCE SIGNS LIST

1 MOS control diode
2 pn diode
3 p-channel MOSFET
4 p-type Schottky diode
5 n-type Schottky diode or pn diode
6 $p^+$ source resistance
7 oblique ion injection
8 present invention
9 prior art
10 vertical ion injection
101 trench gate
102 gate oxide film
103 P2 layer (anode layer)
104 $n^-$ drift layer
105 $n^+$ layer (cathode layer)
106 cathode electrode
107 Insulating oxide film
108 anode electrode
109 contact hole
110 insulating film spacer
111 high-concentration source $p^+$ layer
112 P1 layer (low-concentration source layer)
113 n-well layer
201 side gate
500 power conversion device
501 to 506 power switching element
511 to 516 gate circuit
521 to 526 diode
531 P terminal
532 N terminal
533 U terminal
534 V terminal
535 W terminal
A anode
K cathode
G gate
FV forward voltage
FC forward current

The invention claimed is:

1. A semiconductor device comprising:

a semiconductor substrate having a drift layer of a first conductivity type;

an anode layer of a second conductivity type provided on the drift layer and constituting a PN junction diode together with the drift layer;

a well layer of the first conductivity type provided on the anode layer;

a low-concentration source layer of the second conductivity type provided on the well layer;

a high-concentration source layer of the second conductivity type provided only in a portion of the low-concentration source layer;

a gate electrode which is adjacent to the anode layer, the well layer, and the low-concentration source layer with a gate oxide film interposed therebetween and constitutes a MOSFET together with the anode layer, the well layer, and the low-concentration source layer;

an insulating film covering the anode layer, the low-concentration source layer, the high-concentration source layer, and the gate electrode; and a contact hole penetrating the insulating film, the high-concentration source layer, the low-concentration source layer, and the well layer.

2. The semiconductor device according to claim 1, wherein a width of the high-concentration source layer measured from the contact hole is equal to or more than ½ of a thickness of the high-concentration source layer.

3. The semiconductor device according to claim 2, wherein the width of the high-concentration source layer measured from the contact hole is equal to or less than a thickness of the high-concentration source layer.

4. The semiconductor device according to claim 1, wherein the contact hole has a side wall shaped to have a lower surface narrower than an upper surface thereof.

5. The semiconductor device according to claim 1, wherein the gate electrode comprises a trench gate comprising a trench provided in the anode layer, and polysilicon embedded in the trench.

6. The semiconductor device according to claim 1, wherein the gate electrode has a side gate configuration which is adjacent to the anode layer, the well layer, and the low-concentration source layer with a gate oxide film having a substantially L-shaped cross section interposed therebetween, and which has an upper portion with a width smaller than a width of a lower portion thereof.

7. A power conversion device comprising:

a pair of DC terminals;

AC terminals, the number of which being equal to the number of phases of an AC output;

switching legs, the number of which being equal to the number of the phases of the AC output, each switching leg being connected between the pair of DC terminals and comprising two parallel circuits connected in series to each other, each parallel circuit comprising a switching element and a diode connected reversely in parallel to the switching element; and a gate circuit for controlling the switching element and the diode, wherein the diode comprises the semiconductor device according to claim 1.

8. A method for manufacturing a semiconductor device for manufacturing the semiconductor device according to claim 1, the method comprising:

(a) a process for forming an anode layer of a second conductivity type on a semiconductor substrate having a drift layer of a first conductivity type;

(b) a process for forming a well layer of the first conductivity type on the anode layer;

(c) a process for forming a low-concentration source layer of the second conductivity type on the well layer;

(d) a process for forming an insulating film on the low-concentration source layer, and forming a contact hole in the insulating film by photolithography and dry etching;

(e) a process for forming a high-concentration source layer of the second conductivity type only in a portion of the low-concentration source layer by oblique ion injection through the contact hole; and (f) a process for extending the contact hole by dry etching using the insulating film as a mask to cause the contact hole to penetrate the high-concentration source layer, the low-concentration source layer, and the well layer.

9. A method for manufacturing a semiconductor device for manufacturing the semiconductor device according to claim 1, the method comprising:

(a) a process for forming an anode layer of a second conductivity type on a semiconductor substrate having a drift layer of a first conductivity type;

(b) a process for forming a well layer of the first conductivity type on the anode layer;

(c) a process for forming a low-concentration source layer of the second conductivity type on the well layer;

(d) a process for forming an insulating film on the low-concentration source layer, and forming a contact hole in the insulating film by photolithography and dry etching;

(e) a process for forming a high-concentration source layer of the second conductivity type only in a portion of the low-concentration source layer by vertical ion injection through the contact hole;

(f) a process for forming an insulating film on the high-concentration source layer, and thinning the insulating film by dry etching to form an insulating film spacer in the contact hole; and (g) a process for extending the contact hole by dry etching using the insulating film spacer as a mask to cause the contact hole to penetrate the high-concentration source layer, the low-concentration source layer, and the well layer.

* * * * *